(12) United States Patent
Lin et al.

(10) Patent No.: US 11,355,571 B2
(45) Date of Patent: Jun. 7, 2022

(54) OLED DISPLAY PANEL HAVING STORAGE CAPACITOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Zhenguo Lin, Shenzhen (CN); Xingyu Zhou, Shenzhen (CN); Yuanjun Hsu, Shenzhen (CN)

(*) Notice: Subject to any disclaimer, the term of this patent is extended or adjusted under 35 U.S.C. 154(b) by 297 days.

(21) Appl. No.: 16/619,830

(22) PCT Filed: Nov. 20, 2019

(86) PCT No.: PCT/CN2019/119649
§ 371 (c)(1),
(2) Date: Dec. 5, 2019

(87) PCT Pub. No.: WO2021/088129
PCT Pub. Date: May 14, 2021

(65) Prior Publication Data
US 2021/0359059 A1    Nov. 18, 2021

(30) Foreign Application Priority Data

Nov. 6, 2019   (CN) .......................... 201911077309.X

(51) Int. Cl.
*H01L 29/08*    (2006.01)
*H01L 27/32*    (2006.01)
(Continued)

(52) U.S. Cl.
CPC ...... *H01L 27/3265* (2013.01); *H01L 27/3246* (2013.01); *H01L 27/3262* (2013.01);
(Continued)

(58) Field of Classification Search
CPC ............. H01L 27/3265; H01L 27/3246; H01L 27/3262; H01L 27/3272; H01L 51/56;
(Continued)

(56) References Cited

U.S. PATENT DOCUMENTS 9,299,757 B2    3/2016  Ko
2017/0345152 A1* 11/2017 Han ..................... G06K 9/0002
(Continued)

FOREIGN PATENT DOCUMENTS

CN          1710469 A    12/2005
CN        102270656 A    12/2011
(Continued)

*Primary Examiner* — Phuc T Dang
(74) *Attorney, Agent, or Firm* — JMB Davis Ben-David

(57) ABSTRACT

The present disclosure provides an OLED display panel which includes a substrate, a drive circuit layer, a light-emitting functional layer, and a pixel definition layer. The light-emitting functional layer includes a light-emitting area and a non-light-emitting area. The drive circuit layer includes a buffer layer, a first electrode plate, and a second electrode plate, and the first electrode plate and the second electrode plate form a storage capacitor. It solves the technical problem of current OLED display panels having dark stripes by not depositing the first electrode plate when silicon nitride is deposited to form a first buffer layer which prevents ionic gases produced when silicon nitride is deposited from having a reduction reaction with the first electrode plate.

19 Claims, 4 Drawing Sheets

(51) Int. Cl.
  *H01L 51/56* (2006.01)
  *H01L 27/12* (2006.01)
  *H01L 29/49* (2006.01)
  *H01L 29/66* (2006.01)
  *H01L 29/786* (2006.01)

(52) U.S. Cl.
  CPC .......... *H01L 27/3272* (2013.01); *H01L 51/56* (2013.01); *H01L 27/127* (2013.01); *H01L 27/1225* (2013.01); *H01L 27/1255* (2013.01); *H01L 29/4908* (2013.01); *H01L 29/66969* (2013.01); *H01L 29/7869* (2013.01); *H01L 29/78633* (2013.01); *H01L 2227/323* (2013.01)

(58) Field of Classification Search
  CPC ............. H01L 27/1225; H01L 27/1255; H01L 28/4908; H01L 29/66989; H01L 29/78633; H01L 29/7869; H01L 2227/323

USPC .......................................................... 257/40
See application file for complete search history.

(56) References Cited

U.S. PATENT DOCUMENTS

2018/0277685 A1* 9/2018 Chen .................. H01L 29/41733
2020/0212221 A1* 7/2020 Baeck ................ H01L 29/78627

FOREIGN PATENT DOCUMENTS

| CN | 104022141 A | 9/2014 |
| CN | 105470262 A | 4/2016 |
| CN | 105514116 A | 4/2016 |
| CN | 106601778 A | 4/2017 |
| CN | 107665909 A | 2/2018 |
| CN | 109119440 A | 1/2019 |
| CN | 111668242 A | 9/2020 |

* cited by examiner

OLED DISPLAY PANEL HAVING STORAGE CAPACITOR AND MANUFACTURING METHOD THEREOF

CROSS-REFERENCE TO RELATED APPLICATIONS

This is the U.S. National Stage of International Patent Application No. PCT/CN2019/119649, filed Nov. 20, 2019, which in turn claims the benefit of Chinese Patent Application No. 201911077309.X, filed Nov. 6, 2019.

FIELD OF INVENTION

The present disclosure relates to the field of display technologies, and more particularly, to an OLED display panel and a manufacturing method thereof.

BACKGROUND OF INVENTION

In current OLED display panels, during the process of depositing silicon nitride to form a buffer layer, plasma gases of silicon nitride will react with indium tin oxide or indium zinc oxide, thereby producing dark stripes.

Therefore, current OLED display panels have the technical problem of dark stripes.

SUMMARY OF INVENTION

The present disclosure provides an OLED display panel to solve the technical problem of dark stripes in current OLED display panels.

To solve the above problems, an embodiment of the present disclosure provides following technical solutions:

an embodiment of the present disclosure provides an OLED display panel which comprises:

a substrate;

a light-emitting functional layer including a light-emitting area and a non-light-emitting area;

a pixel definition layer disposed on the light-emitting functional layer;

a drive circuit layer including a buffer layer, a first electrode plate, and a second electrode plate; wherein the buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor.

In an embodiment of the present disclosure, the storage capacitor is disposed in the light-emitting area, and the first electrode plate and the second electrode plate are transparent materials.

In an embodiment of the present disclosure, material of the first electrode plate is at least one selected from the group consisting of indium tin oxide or indium zinc oxide.

In an embodiment of the present disclosure, the drive circuit layer comprises a light-shielding layer, the buffer layer, an active layer, a gate insulation layer, a gate electrode layer, an interlayer insulation layer, and a source/drain electrode layer which are disposed in a stack.

In an embodiment of the present disclosure, material of the gate electrode layer is one selected from the group consisting of molybdenum, aluminum, copper, or titanium, or at least one alloy.

In an embodiment of the present disclosure, the second electrode plate is formed by patterning the active layer.

In an embodiment of the present disclosure, the second electrode plate and the active layer in a source/drain doped region are disposed on the second buffer layer.

In an embodiment of the present disclosure, the light-shielding layer is formed by patterning a metal layer, material of the metal layer is copper or molybdenum, and the light-shielding layer is as a wiring to gain a design space for wiring.

An embodiment of the present disclosure provides an OLED display device. The OLED display device comprises an OLED display panel, an optical film, and a backlight, the OLED display panel comprises:

a substrate;

a light-emitting functional layer including a light-emitting area and a non-light-emitting area;

a pixel definition layer disposed on the light-emitting functional layer;

a drive circuit layer including a buffer layer, a first electrode plate, and a second electrode plate; wherein the buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor.

In an embodiment of the present disclosure, the storage capacitor is disposed in the light-emitting area, and the first electrode plate and the second electrode plate are transparent materials.

In an embodiment of the present disclosure, material of the first electrode plate is at least one selected from the group consisting of indium tin oxide or indium zinc oxide.

In an embodiment of the present disclosure, the drive circuit layer comprises a light-shielding layer, the buffer layer, an active layer, a gate insulation layer, a gate electrode layer, an interlayer insulation layer, and a source/drain electrode layer which are disposed in a stack.

In an embodiment of the present disclosure, material of the gate electrode layer is one selected from the group consisting of molybdenum, aluminum, copper, or titanium, or at least one alloy.

In an embodiment of the present disclosure, the second electrode plate is formed by patterning the active layer.

In an embodiment of the present disclosure, the second electrode plate and the active layer in a source/drain doped region are disposed on the second buffer layer.

In an embodiment of the present disclosure, the light-shielding layer is formed by patterning a metal layer, material of the metal layer is copper or molybdenum, and the light-shielding layer is as a wiring to gain a design space for wiring.

An embodiment of the present disclosure provides a manufacturing method of an OLED display panel. The method comprises:

providing a substrate;

depositing a metal layer on the substrate and patterning to form a light-shielding layer;

depositing a layer of silicon nitride to form a first buffer layer;

depositing at least one selected from the group consisting of indium tin oxide or indium zinc oxide to form a semiconductor layer, and patterning to form a first electrode plate;

depositing a layer of silicon nitride to form a second buffer layer; and forming a second electrode plate, an active layer, a gate insulation layer, a gate electrode layer, an interlayer insulation layer, a source/drain electrode layer, a light-emitting functional layer, a pixel electrode layer, a pixel definition layer, a common electrode layer, and an encapsulation layer.

In an embodiment of the present disclosure, the step of forming the gate electrode layer comprises: depositing a layer of metal on the gate insulation layer as the gate electrode layer, and material of the metal is molybdenum, aluminum, copper, or titanium, or at least one alloy.

In an embodiment of the present disclosure, the step of forming the second electrode plate comprises: performing a full surface ionic gas treatment on a metal oxide semiconductor material without protection of the above gate insulation layer and the gate electrode layer, after treatment, resistance is significantly reduced, a nitrogen ion conductor layer is formed, the metal oxide semiconductor material under the gate insulation layer is not treated and maintains semiconductor characteristics as a channel of the drive circuit layer, and the metal oxide semiconductor material on the first electrode plate forms the second electrode plate of the storage capacitor via conductorization.

In an embodiment of the present disclosure, the step of forming the source/drain electrode layer comprises: vapor depositing a layer of metal as the source/drain electrode layer, the metal is molybdenum, aluminum, copper, or titanium, or at least one alloy, and a thickness thereof ranges from 2000 Å to 8000 Å.

The beneficial effect of the present disclosure is: the present disclosure provides an OLED display panel and a manufacturing method thereof. The OLED display panel comprises a substrate, a drive circuit layer, a light-emitting functional layer, and a pixel definition layer. The light-emitting functional layer comprises a light-emitting area and a non-light-emitting area, and the pixel definition layer is disposed on the light-emitting functional layer. The drive circuit layer comprises a buffer layer, a first electrode plate, and a second electrode plate. The buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor. It solves the technical problem of current OLED display panels having dark stripes by not depositing the first electrode plate when silicon nitride is deposited to form a first buffer layer which prevents ionic gases produced when silicon nitride is deposited from having a reduction reaction with the first electrode plate.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
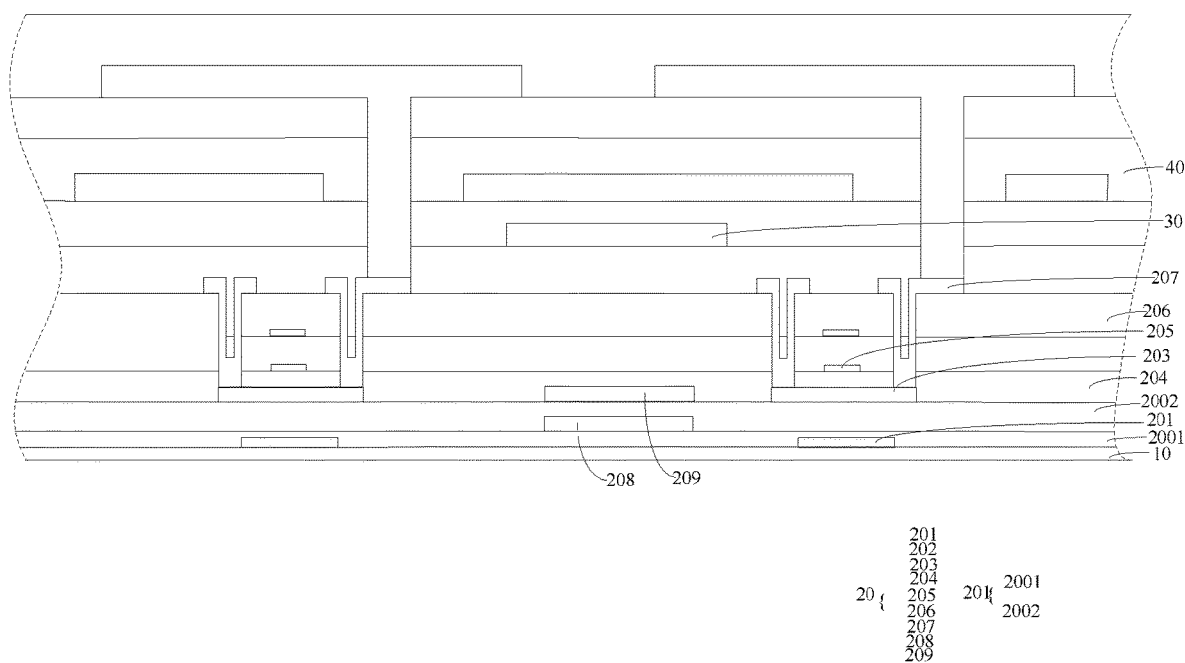
FIG. 1 is a first schematic cross-sectional diagram of an OLED display panel according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

An embodiment of the present disclosure can solve the technical problem of having dark stripes in current OLED display panels.

As shown in FIG. 1, an OLED display panel provided by the present disclosure comprises:

a substrate 10;

a light-emitting functional layer 30 including a light-emitting area and a non-light-emitting area;

a pixel definition layer 40 disposed on the light-emitting functional layer 30;

a drive circuit layer 20 including a buffer layer 202, a first electrode plate 208, and a second electrode plate 209; wherein the buffer layer 202 comprises a first buffer layer 2001 and a second buffer layer 2002, the first buffer layer 2001 is disposed on the substrate 10, the second buffer layer 2002 is disposed on the first buffer layer 2001 away from the substrate 10, the first electrode plate 208 is disposed between the first buffer layer 2001 and the second buffer layer 2002, the second electrode plate 209 is disposed on the second buffer layer 2002 away from the substrate, and the first electrode plate 208 and the second electrode plate 209 form a storage capacitor.

In the embodiment, the OLED display panel comprises:

a substrate;

a light-emitting functional layer including a light-emitting area and a non-light-emitting area;

a pixel definition layer disposed on the light-emitting functional layer;

a drive circuit layer including a buffer layer, a first electrode plate, and a second electrode plate; wherein the buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor. It solves the technical problem of current OLED display panels having dark stripes by not depositing the first electrode plate when silicon nitride is deposited to form a first buffer layer which prevents ionic gases produced when silicon nitride is deposited from having a reduction reaction with the first electrode plate.

In an embodiment of the present disclosure, the storage capacitor is disposed in the light-emitting area, and the first electrode plate 208 and the second electrode plate 209 are transparent materials. The advantage of this setting is that pixel size is reduced and aperture ratio is increased.

In an embodiment of the present disclosure, in the OLED display panel, a size of the storage capacitor is the same as a size of the above corresponding light-emitting area of the light-emitting functional layer 30.

In an embodiment of the present disclosure, in the OLED display panel, a size of the storage capacitor is less than a size of the above corresponding light-emitting area of the light-emitting functional layer 30.

In an embodiment of the present disclosure, material of the first electrode plate 208 is at least one selected from the group consisting of indium tin oxide or indium zinc oxide.

In an embodiment of the present disclosure, material of the second electrode plate 209 is at least one selected from the group consisting of indium gallium zinc oxide, indium zinc tin oxide, or indium gallium zinc tin oxide. Depositing a layer of metal oxide semiconductor material on the second buffer layer 2002, performing a full surface plasma gas treatment on the semiconductor layer, the semiconductor layer without protection of the above gate insulation layer and the gate electrode layer is as the second electrode plate 209 after the treatment.

In an embodiment of the present disclosure, the drive circuit layer 20 comprises a light-shielding layer 201, the buffer layer 202, an active layer 203, a gate insulation layer 204, a gate electrode layer 205, an interlayer insulation layer 206, and a source/drain electrode layer 207 which are disposed in a stack.

In an embodiment of the present disclosure, forming a whole layer on the second buffer layer 2002, and then patterning at the same time to form the active layer 203 in a source/drain doped region 2003 and the second electrode plate 209.

Figure 2:
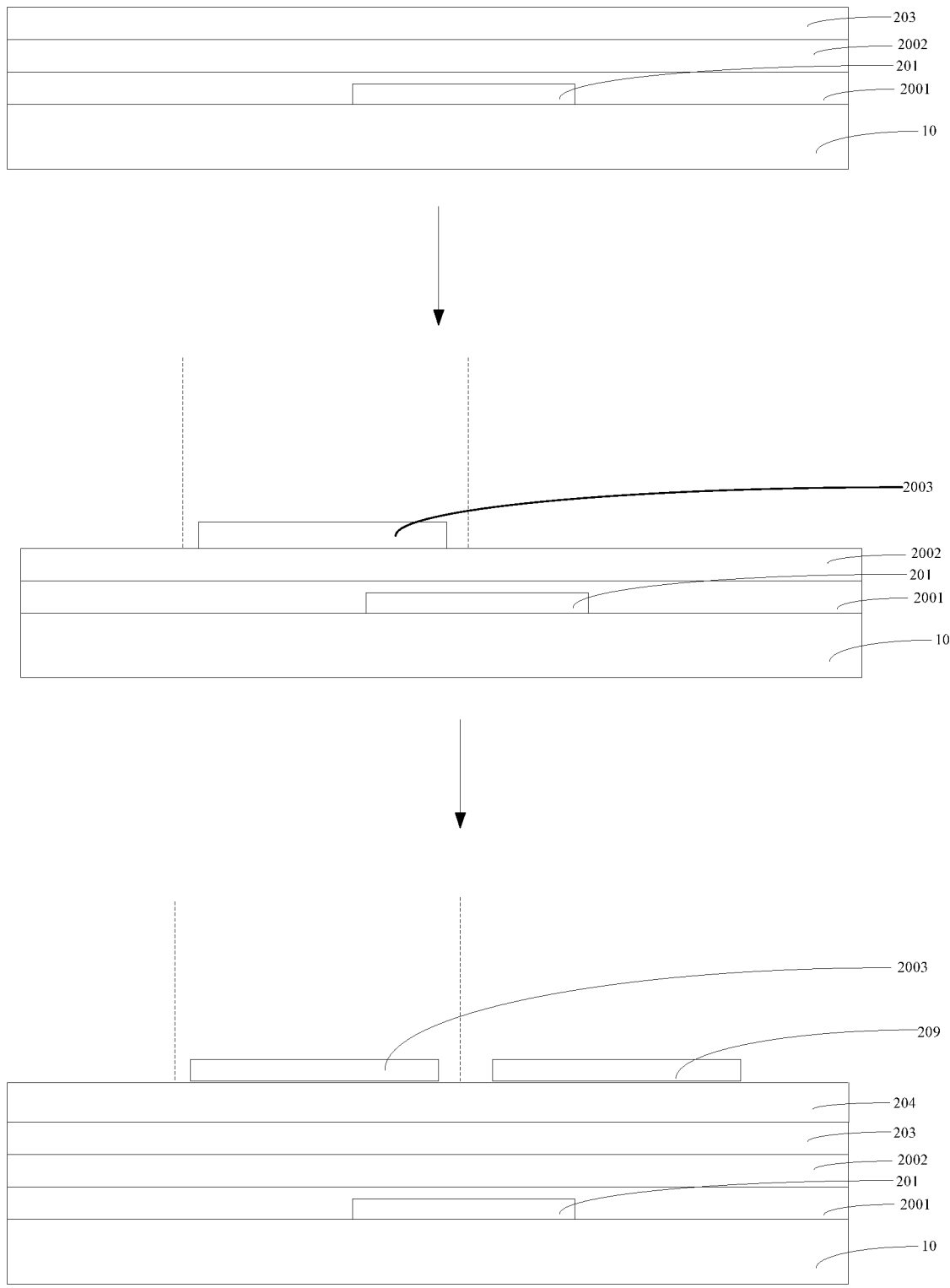
FIG. 2 is a schematic diagram of an OLED display panel when patterning to form a second electrode plate according to an embodiment of the present disclosure.

In an embodiment of the present disclosure, as shown in FIG. 2, forming a whole layer on the second buffer layer 2002, then patterning to form the active layer 203 in the source/drain doped region 2003, and then patterning to form the second electrode plate 209.

In an embodiment of the present disclosure, the second electrode plate 209 is formed by patterning the active layer 203.

In an embodiment of the present disclosure, the second electrode plate 209 and the active layer 203 in the source/drain doped region 2003 are disposed on the second buffer layer 2002.

In an embodiment of the present disclosure, the light-shielding layer 201 is formed by patterning a metal layer, material of the metal layer is copper or molybdenum, and the light-shielding layer 201 is as a wiring to gain a design space for wiring.

Figure 3:
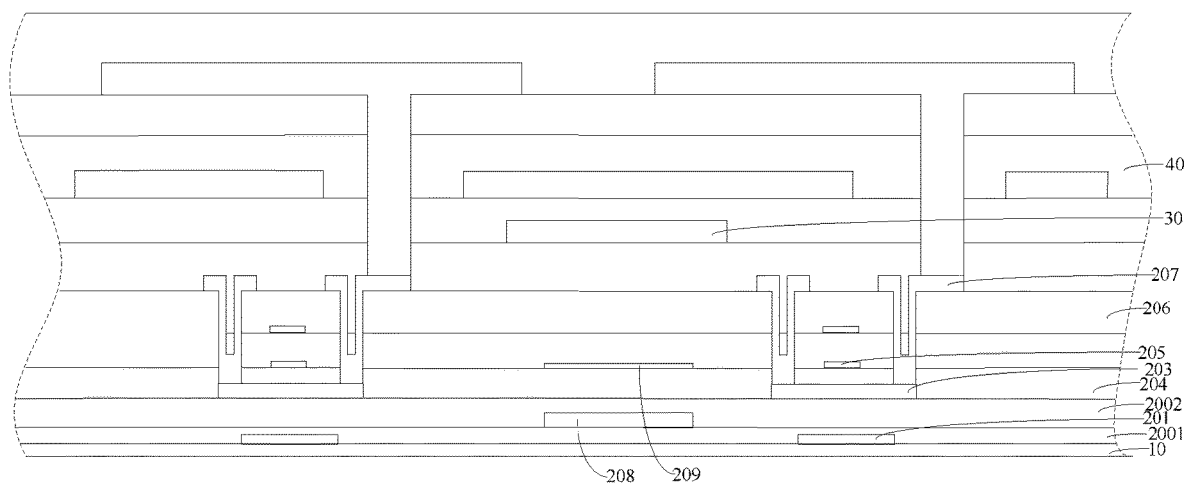
FIG. 3 is a second schematic cross-sectional diagram of an OLED display panel according to an embodiment of the present disclosure.

In an embodiment of the present disclosure, as shown in FIG. 3, in the OLED display panel, the gate electrode layer 205 is patterned to form the second electrode plate 209: first depositing a metal layer on the gate insulation layer 204, and then patterning the metal layer to form the gate electrode 2051 and the second electrode plate 209. The second electrode plate 209 is formed in the light-emitting area, and a capacitor area is combined with the light-emitting area.

In an embodiment of the present disclosure, forming a whole layer on the gate insulation layer 204, and then patterning at the same time to form the gate electrode 2051 and the second electrode plate 209.

In an embodiment of the present disclosure, forming a whole layer on the second buffer layer 2002, then patterning to form the gate electrode 2051, and then patterning to form the second electrode plate 209.

In an embodiment of the present disclosure, in the OLED display panel, the source/drain electrode layer 207 is patterned to form the second electrode plate 209: first, depositing a metal layer on the interlayer insulation layer 206, and then patterning the metal layer to form the source electrode, drain electrode, and the second electrode plate 209 at the same time.

Figure 4:
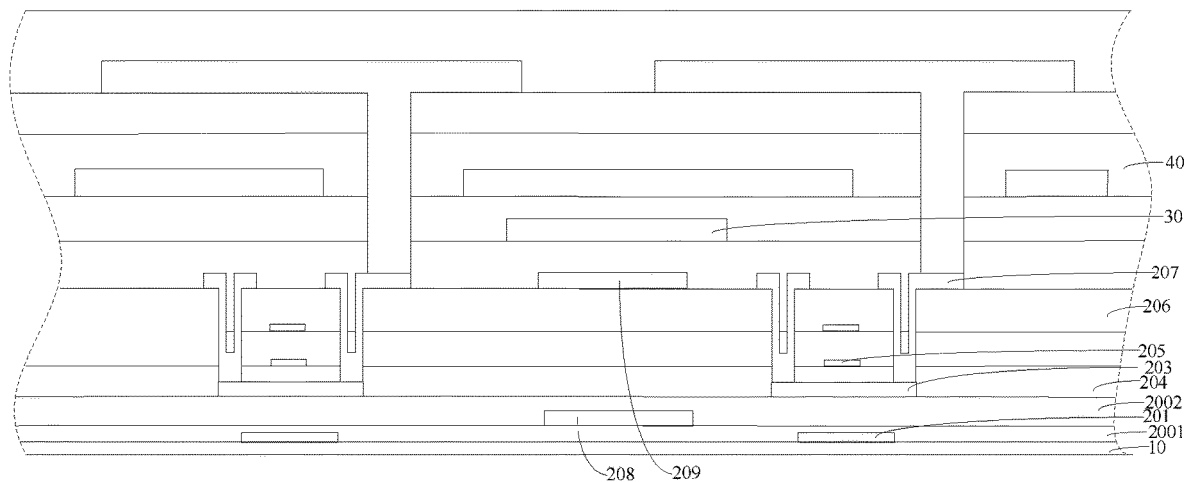
FIG. 4 is a third schematic cross-sectional diagram of an OLED display panel according to an embodiment of the present disclosure.

In an embodiment of the present disclosure, as shown in FIG. 4, in the OLED display panel, the source/drain electrode layer 207 is patterned to form the second electrode plate 209: first, depositing a metal layer on the interlayer insulation layer 206, then patterning the metal layer to form the source electrode and the drain electrode, and then patterning to form the second electrode plate 209.

In an embodiment of the present disclosure, in the OLED display panel, the first buffer layer 2001 is made of silicon nitride, its thickness ranges from 300 Å to 10000 Å, and meanwhile silicon nitride can be used as a copper diffusion barrier layer and a copper protective layer.

In an embodiment of the present disclosure, in the OLED display panel, the first buffer layer 2001 is made of silicon nitride, its thickness ranges from 500 Å to 6000 Å, and meanwhile it can also be used as a contact layer for indium gallium zinc oxide.

In an embodiment of the present disclosure, a thickness of the second electrode plate 209 ranges from 100 Å to 1000 Å, and the second electrode plate 209 is made of a metal oxide semiconductor material. Performing a full surface ionic gas treatment on the metal oxide semiconductor material without protection of the above gate insulation layer and the gate electrode layer, a resistance is significantly reduced after the treatment, and a nitrogen ion conductor layer is formed and used as the second electrode plate. The metal oxide semiconductor material under the gate insulation layer 204 is not treated and maintains semiconductor characteristics as a channel of the drive circuit layer 20, and the metal oxide semiconductor material on the first electrode plate 208 forms the second electrode plate 209 of the storage capacitor via conductorization.

In an embodiment of the present disclosure, in the OLED display panel, the gate insulation layer 204 is made of silicon oxide, silicon nitride or a multilayer structure film, its thickness ranges from 1000 Å to 3000 Å, and it is mainly for insulation, separating the active layer 203 from the gate electrode layer 205.

In an embodiment of the present disclosure, in the OLED display panel, material of the gate electrode layer 205 is one selected from the group consisting of molybdenum, aluminum, copper, or titanium, or at least one alloy. Its thickness ranges from 2000 Å to 10000 Å.

In an embodiment of the present disclosure, in the OLED display panel, the interlayer insulation layer 206 is made of silicon oxide, silicon nitride or a multilayer structure film, its thickness ranges from 2000 Å to 10000 Å, and it is formed by photolithography and etching.

In an embodiment of the present disclosure, in the OLED display panel, material of the source/drain electrode layer 207 is one selected from the group consisting of molybdenum, aluminum, copper, or titanium, or at least one alloy. Its thickness ranges from 2000 Å to 8000 Å. It defines a pattern.

In an embodiment of the present disclosure, in the OLED display panel, a passivation layer is made of silicon oxide, silicon nitride, or a multilayer structure film, and its thickness ranges from 1000 Å to 5000 Å.

In an embodiment of the present disclosure, the first electrode plate of the storage capacitor is disposed between the first buffer layer 2001 and the second buffer layer 2002, reducing the area of the storage capacitor, and increasing storage capacitance.

In an embodiment of the present disclosure, the buffer layer 202 uses a stacked structure of the first buffer layer 2001 and the second buffer layer 2002 to prevent copper oxidation.

An embodiment of the present disclosure further provides an OLED display device. The OLED display device comprises a display panel, as shown in FIG. 1. The display panel comprises:

a substrate 10;

a light-emitting functional layer 30 including a light-emitting area and a non-light-emitting area;

a pixel definition layer 40 disposed on the light-emitting functional layer 30;

a drive circuit layer 20 including a buffer layer 202, a first electrode plate 208, and a second electrode plate 209; wherein the buffer layer 202 comprises a first buffer layer 2001 and a second buffer layer 2002, the first buffer layer 2001 is disposed on the substrate 10, the second buffer layer 2002 is disposed on the first buffer layer 2001 away from the substrate 10, the first electrode plate 208 is disposed between the first buffer layer 2001 and the second buffer layer 2002, the second electrode plate 209 is disposed on the second buffer layer 2002 away from the substrate, and the first electrode plate 208 and the second electrode plate 209 form a storage capacitor.

In the embodiment, the OLED display device comprises an OLED display panel. The OLED display panel comprises:

a substrate;

a light-emitting functional layer including a light-emitting area and a non-light-emitting area;

a pixel definition layer disposed on the light-emitting functional layer;

a drive circuit layer including a buffer layer, a first electrode plate, and a second electrode plate; wherein the buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor. It solves the technical problem of current OLED display panels having dark stripes by not depositing the first electrode plate when silicon nitride is deposited to form a first buffer layer which prevents ionic gases produced when silicon nitride is deposited from having a reduction reaction with the first electrode plate.

In an embodiment of the present disclosure, in the OLED display device, the storage capacitor is disposed in the light-emitting area, and the first electrode plate 208 and the second electrode plate 209 are transparent materials, thereby reducing the pixel size and increasing the aperture ratio.

In an embodiment of the present disclosure, in the OLED display device, a size of the storage capacitor is the same as a size of the above corresponding light-emitting area of the light-emitting functional layer 30.

In an embodiment of the present disclosure, in the OLED display device, a size of the storage capacitor is less than a size of the above corresponding light-emitting area of the light-emitting functional layer 30.

In an embodiment of the present disclosure, material of the first electrode plate 208 is at least one selected from the group consisting of indium tin oxide or indium zinc oxide.

In an embodiment of the present disclosure, material of the second electrode plate 209 is at least one selected from the group consisting of indium gallium zinc oxide, indium zinc tin oxide, or indium gallium zinc tin oxide. Depositing a layer of metal oxide semiconductor material on the second buffer layer 2002, performing a full surface plasma gas treatment on the semiconductor layer, the semiconductor layer without protection of the above gate insulation layer and the gate electrode layer is as the second electrode plate 209 after the treatment.

In an embodiment of the present disclosure, the drive circuit layer 20 comprises a light-shielding layer 201, the buffer layer 202, an active layer 203, a gate insulation layer 204, a gate electrode layer 205, an interlayer insulation layer 206, and a source/drain electrode layer 207 which are disposed in a stack.

In an embodiment of the present disclosure, forming a whole layer on the second buffer layer 2002, and then patterning at the same time to form the active layer 203 in a source/drain doped region 2003 and the second electrode plate 209.

In an embodiment of the present disclosure, as shown in FIG. 2, forming a whole layer on the second buffer layer 2002, then patterning to form the active layer 203 in the source/drain doped region 2003, and then patterning to form the second electrode plate 209.

In an embodiment of the present disclosure, the second electrode plate 209 is formed by patterning the active layer 203.

In an embodiment of the present disclosure, the second electrode plate 209 and the active layer 203 in the source/drain doped region 2003 are disposed on the second buffer layer 2002.

In an embodiment of the present disclosure, the light-shielding layer 201 is formed by patterning a metal layer, material of the metal layer is copper or molybdenum, and the light-shielding layer 201 is as a wiring to gain a design space for wiring.

In an embodiment of the present disclosure, as shown in FIG. 3, in the OLED display device, the second electrode plate 209 is formed by patterning the gate electrode layer 205: first, forming a whole layer of the gate electrode layer 205, and then the gate electrode layer 205 is patterned to form the gate electrode 2051 and the second electrode plate 209. The second electrode plate 209 is formed in the light-emitting area.

In an embodiment of the present disclosure, forming a whole layer on the gate insulation layer 204, and then patterning at the same time to form the gate electrode 2051 and the second electrode plate 209.

In an embodiment of the present disclosure, forming a whole layer on the second buffer layer 2002, then patterning to form the gate electrode 2051, and then patterning to form the second electrode plate 209.

In an embodiment of the present disclosure, in the OLED display device, the source/drain electrode layer 207 is patterned to form the second electrode plate 209: first, depositing a metal layer on the interlayer insulation layer 206, and then patterning the metal layer to form the source electrode, drain electrode, and the second electrode plate 209 at the same time.

In an embodiment of the present disclosure, as shown in FIG. 4, in the OLED display device, the source/drain electrode layer 207 is patterned to form the second electrode plate 209: first, depositing a metal layer on the interlayer insulation layer 206, then patterning the metal layer to form the source electrode and the drain electrode, and then patterning to form the second electrode plate 209. In an embodiment of the present disclosure, in the OLED display device, the first buffer layer 2001 is made of silicon nitride, its thickness ranges from 300 Å to 10000 Å, and meanwhile silicon nitride can be used as a copper diffusion barrier layer and a copper protective layer.

In an embodiment of the present disclosure, in the OLED display device, the first buffer layer 2001 is made of silicon nitride, its thickness ranges from 500 Å to 6000 Å, and meanwhile it can also be used as a contact layer for indium gallium zinc oxide.

In an embodiment of the present disclosure, a thickness of the second electrode plate 209 ranges from 100 Å to 1000 Å, and the second electrode plate 209 is made of a metal oxide semiconductor material. Performing a full surface ionic gas treatment on the metal oxide semiconductor material without protection of the above gate insulation layer 204 and the gate electrode 2051, a resistance is significantly reduced after the treatment, and a nitrogen ion conductor layer is formed. The metal oxide semiconductor material under the gate insulation layer 204 is not treated and maintains semiconductor characteristics as a channel of the drive circuit layer 20, and the metal oxide semiconductor material on the first electrode plate 208 forms the second electrode plate 209 of the storage capacitor via conductorization.

In an embodiment of the present disclosure, in the OLED display device, the gate insulation layer 204 is made of silicon oxide, silicon nitride or a multilayer structure film, its thickness ranges from 1000 Å to 3000 Å, and it is mainly for insulation, separating the active layer 203 from the gate electrode layer 205.

In an embodiment of the present disclosure, in the OLED display device, material of the gate electrode layer 205 is one selected from the group consisting of molybdenum, aluminum, copper, or titanium, or at least one alloy. Its thickness ranges from 2000 Å to 10000 Å.

In an embodiment of the present disclosure, in the OLED display device, the interlayer insulation layer 206 is made of silicon oxide, silicon nitride or a multilayer structure film, its thickness ranges from 2000 Å to 10000 Å, and it is formed by photolithography and etching.

In an embodiment of the present disclosure, in the OLED display device, material of the source/drain electrode layer 207 is one selected from the group consisting of molybdenum, aluminum, copper, or titanium, or at least one alloy. Its thickness ranges from 2000 Å to 8000 Å. It defines a pattern.

In an embodiment of the present disclosure, in the OLED display device, a passivation layer is made of silicon oxide, silicon nitride or a multilayer structure film, and its thickness ranges from 1000 Å to 5000 Å.

In an embodiment of the present disclosure, in the OLED display device, the first electrode plate of the storage capacitor is disposed between the first buffer layer 2001 and the second buffer layer 2002, reducing the area of the storage capacitor, and increasing storage capacitance.

In an embodiment of the present disclosure, in the OLED display device, the buffer layer 202 uses a stacked structure of the first buffer layer 2001 and the second buffer layer 2002 to prevent copper oxidation.

Figure 5:
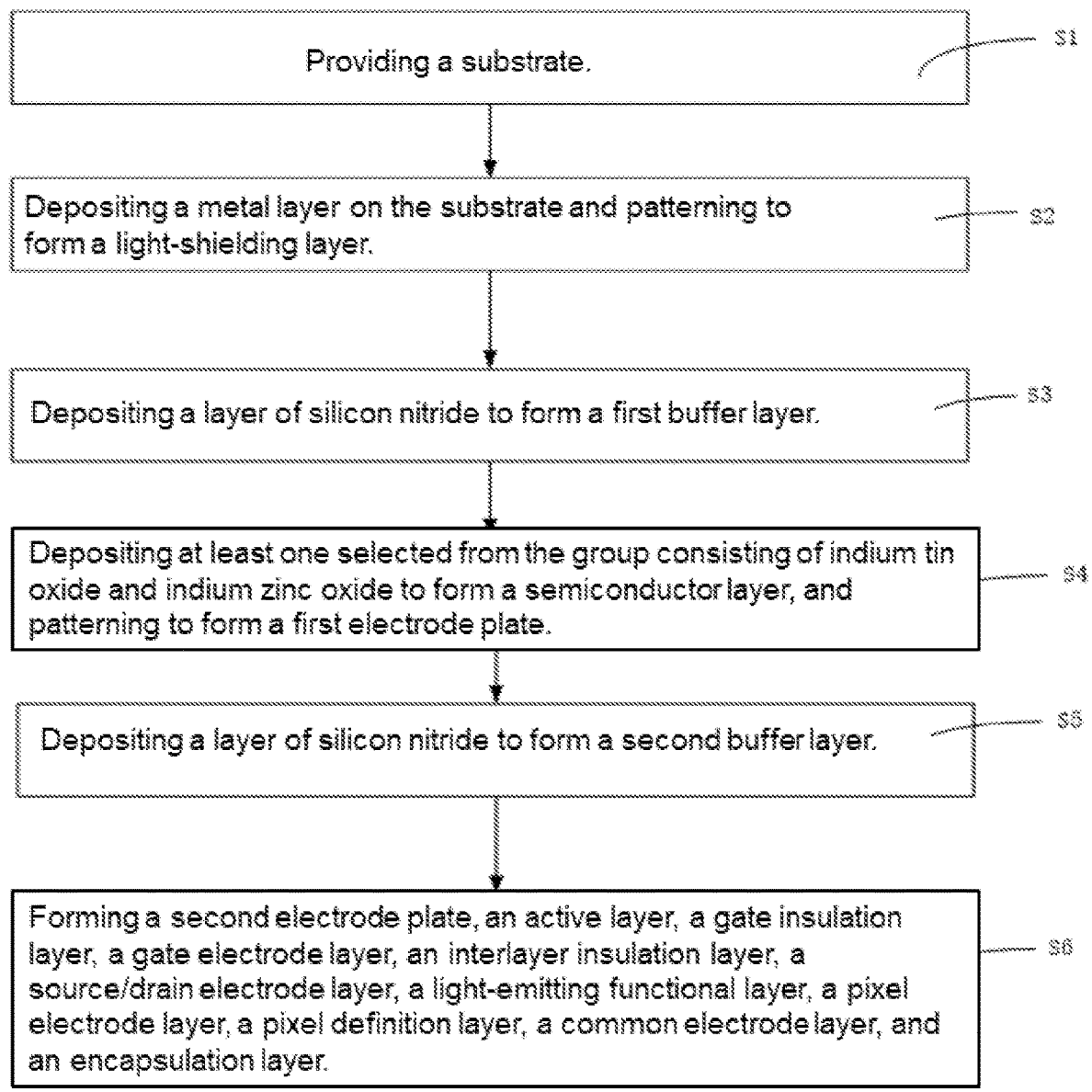
FIG. 5 is a flowchart of a manufacturing method of an OLED display panel according to an embodiment of the present disclosure.

As shown in FIG. 5, an embodiment of the present disclosure further provides a manufacturing method of an OLED display panel. The method comprises:

S1: providing a substrate 10;

S2: depositing a metal layer on the substrate 10 and patterning to form a light-shielding layer 201;

S3: depositing a layer of silicon nitride to form a first buffer layer 2001;

S4: depositing at least one selected from the group consisting of indium tin oxide or indium zinc oxide to form a semiconductor layer, and patterning to form a first electrode plate 208;

S5: depositing a layer of silicon nitride to form a second buffer layer 2002; and S6: forming a second electrode plate 209, an active layer 203, a gate insulation layer 204, a gate electrode layer 205, an interlayer insulation layer 206, a source/drain electrode layer 207, a light-emitting functional layer 30, a pixel electrode layer, a pixel definition layer 40, a common electrode layer, and an encapsulation layer.

In an embodiment of the present disclosure, the step of forming the second electrode plate 209 comprises: depositing a layer of metal oxide semiconductor material on the second buffer layer, performing a full surface ionic gas treatment on the semiconductor layer, the metal oxide semiconductor material without protection of the above gate insulation layer and the gate electrode layer forms the second electrode plate 209 after the treatment.

In an embodiment of the present disclosure, the step of forming the gate electrode 2051 metal layer comprises: forming the gate electrode 2051 metal layer by vapor deposition. The material thereof can be molybdenum, aluminum, copper, or titanium, or at least one alloy, and a thickness thereof ranges from 2000 Å to 10,000 Å.

In an embodiment of the present disclosure, the step of forming the gate insulation layer 204 comprises: using photolithography etching the gate electrode 2051 metal to form a pattern, and then using the pattern as a mask to etch the gate insulation layer 204. The gate insulation layer 204 is remained only under the film layer of the patterned gate electrode 2051 metal, and other parts of the gate insulation layer 204 are etched away.

In an embodiment of the present disclosure, the step of forming the second electrode plate 209 comprises: performing a full surface ionic gas treatment on the metal oxide semiconductor material without protection of the above gate insulation layer 204 and the gate electrode 2051, a resistance is significantly reduced after the treatment, and a nitrogen ion conductor layer is formed. The metal oxide semiconductor material under the gate insulation layer 204 is not treated and maintains semiconductor characteristics as a channel of the drive circuit layer 20, and the metal oxide semiconductor material on the first electrode plate 208 forms the second electrode plate 209 of the storage capacitor via conductorization.

In an embodiment of the present disclosure, the step of forming the interlayer insulation layer 206 comprises: forming the interlayer insulation layer 206 by vapor deposition, and then performing photolithography and etching processes. The material thereof is silicon oxide, silicon nitride, or a multilayer structure film, and a thickness thereof ranges from 2000 Å to 10,000 Å.

In an embodiment of the present disclosure, the step of forming the source/drain electrode layer 207 comprises: vapor depositing a layer of metal as the source/drain electrode layer and then defining a pattern, the metal is molybdenum, aluminum, copper, or titanium, or at least one alloy, and a thickness thereof ranges from 2000 Å to 8000 Å.

It can be known according to the above embodiments:

the present disclosure provides an OLED display panel and a manufacturing method thereof. The OLED display panel comprises a substrate, a drive circuit layer, a light-emitting functional layer, and a pixel definition layer. The light-emitting functional layer comprises a light-emitting area and a non-light-emitting area, and the pixel definition layer is disposed on the light-emitting functional layer. The drive circuit layer comprises a buffer layer, a first electrode plate, and a second electrode plate. The buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor. It solves the technical problem of current OLED display panels having dark stripes by not depositing the first electrode plate when silicon nitride is deposited to form a first buffer layer which prevents ionic gases produced when silicon nitride is deposited from having a reduction reaction with the first electrode plate.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An organic light-emitting diode (OLED) display panel, comprising:
   a substrate;
   a light-emitting functional layer including a light-emitting area and a non-light-emitting area;
   a pixel definition layer disposed on the light-emitting functional layer; and
   a drive circuit layer including a buffer layer, a first electrode plate, and a second electrode plate; wherein the buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor.

2. The OLED display panel according to claim 1, wherein the storage capacitor is disposed in the light-emitting area, and the first electrode plate and the second electrode plate are transparent materials.

3. The OLED display panel according to claim 2, wherein material of the first electrode plate is at least one selected from the group consisting of indium tin oxide or indium zinc oxide.

4. The OLED display panel according to claim 2, wherein the drive circuit layer comprises a light-shielding layer, the buffer layer, an active layer, a gate insulation layer, a gate electrode layer, an interlayer insulation layer, and a source/drain electrode layer which are disposed in a stack.

5. The OLED display panel according to claim 4, wherein material of the gate electrode layer is one selected from the group consisting of molybdenum, aluminum, copper, or titanium, or at least one alloy.

6. The OLED display panel according to claim 4, wherein the second electrode plate is formed by patterning the active layer.

7. The OLED display panel according to claim 4, wherein the second electrode plate and the active layer in a source/drain doped region are disposed on the second buffer layer.

8. The OLED display panel according to claim 4, wherein a metal layer is patterned to form the light-shielding layer, material of the metal layer is copper or molybdenum, and the light-shielding layer is a wiring layer.

9. An organic light-emitting diode (OLED) display device, comprising an OLED display panel, an optical film, and a backlight, the OLED display panel comprising:
   a substrate;
   a light-emitting functional layer including a light-emitting area and a non-light-emitting area;
   a pixel definition layer disposed on the light-emitting functional layer; and
   a drive circuit layer including a buffer layer, a first electrode plate, and a second electrode plate; wherein the buffer layer comprises a first buffer layer and a second buffer layer, the first buffer layer is disposed on the substrate, the second buffer layer is disposed on the first buffer layer away from the substrate, the first electrode plate is disposed between the first buffer layer and the second buffer layer, the second electrode plate is disposed on the second buffer layer away from the substrate, and the first electrode plate and the second electrode plate form a storage capacitor.

10. The OLED display device according to claim 9, wherein the storage capacitor is disposed in the light-emitting area, and the first electrode plate and the second electrode plate are transparent materials.

11. The OLED display device according to claim 10, wherein material of the first electrode plate is at least one selected from the group consisting of indium tin oxide or indium zinc oxide.

12. The OLED display device according to claim 10, wherein the drive circuit layer comprises a light-shielding layer, the buffer layer, an active layer, a gate insulation layer, a gate electrode layer, an interlayer insulation layer, and a source/drain electrode layer which are disposed in a stack.

13. The OLED display device according to claim 12, wherein material of the gate electrode layer is one selected from the group consisting of molybdenum, aluminum, copper, or titanium, or at least one alloy.

14. The OLED display device according to claim 12, wherein the second electrode plate is formed by patterning the active layer.

15. The OLED display device according to claim 12, wherein the second electrode plate and the active layer in a source/drain doped region are disposed on the second buffer layer.

16. The OLED display device according to claim 12, wherein a metal layer is patterned to form the light-shielding layer, material of the metal layer is copper or molybdenum, and the light-shielding layer is a wiring layer.

17. A manufacturing method of an organic light-emitting diode (OLED) display panel, comprising:
  providing a substrate;
  depositing a metal layer on the substrate and patterning to form a light-shielding layer;
  depositing a layer of silicon nitride to form a first buffer layer;
  depositing at least one selected from the group consisting of indium tin oxide or indium zinc oxide to form a semiconductor layer, and patterning to form a first electrode plate;
  depositing a layer of silicon nitride to form a second buffer layer; and
  forming a second electrode plate, an active layer, a gate insulation layer, a gate electrode layer, an interlayer insulation layer, a source/drain electrode layer, a light-emitting functional layer, a pixel electrode layer, a pixel definition layer, a common electrode layer, and an encapsulation layer;
  wherein the step of forming the second electrode plate comprises: performing a full surface ionic gas treatment on a metal oxide semiconductor material without protection of the above gate insulation layer and the gate electrode layer, after treatment, resistance is significantly reduced, a nitrogen ion conductor layer is formed, the metal oxide semiconductor material under the gate insulation layer is not treated and maintains semiconductor characteristics as a channel of the drive circuit layer, and the metal oxide semiconductor material on the first electrode plate forms the second electrode plate of the storage capacitor via conductorization.

18. The manufacturing method of the OLED display panel according to claim 17, wherein the step of forming the gate electrode layer comprises: depositing a layer of metal on the gate insulation layer as the gate electrode layer, and material of the metal is molybdenum, aluminum, copper, or titanium, or at least one alloy.

19. The manufacturing method of the OLED display panel according to claim 17, wherein the step of forming the source/drain electrode layer comprises: vapor depositing a layer of metal as the source/drain electrode layer, the metal is molybdenum, aluminum, copper, or titanium, or at least one alloy, and a thickness thereof ranges from 2000 Å to 8000 Å.

* * * * *